United States Patent [19]
Smith

[11] Patent Number: 5,155,420
[45] Date of Patent: Oct. 13, 1992

[54] SWITCHING CIRCUITS EMPLOYING FIELD EMISSION DEVICES

[76] Inventor: Robert T. Smith, 2505 E. Lockwood, Mesa, Ariz. 85213

[21] Appl. No.: 740,265

[22] Filed: Aug. 5, 1991

[51] Int. Cl.$^5$ ............................................. H01J 1/02
[52] U.S. Cl. .................................. 315/349; 307/299.1; 313/309; 313/336
[58] Field of Search ............. 315/349; 307/445, 299.1; 313/309, 336, 351

[56] References Cited

U.S. PATENT DOCUMENTS

| | | | |
|---|---|---|---|
| 4,578,614 | 3/1986 | Gray et al. | 313/309 |
| 4,987,377 | 1/1991 | Gray et al. | 313/309 X |
| 5,003,216 | 3/1991 | Hicks | 313/336 X |
| 5,012,153 | 4/1991 | Atkinson et al. | 313/336 |
| 5,030,921 | 7/1991 | Kane | 313/309 X |

*Primary Examiner*—Eugene R. LaRoche
*Assistant Examiner*—Son Dinh

[57] ABSTRACT

A differential amplifier current steering circuit wherein the active circuit elements are realized as field emission devices (FEDs) which provide for an extended range of operation to include modulation/demodulation applications up to the order of one Terahertz and digital logic function applications up to the order of one hundred gigabits per second. In a particular embodiment of the FED switching circuit vertical integration of selectively interconnected FEDs is employed to provide the desired switching circuit function.

13 Claims, 5 Drawing Sheets

SWITCHING CIRCUITS EMPLOYING FIELD EMISSION DEVICES

FIELD OF THE INVENTION

The present invention relates generally to cold-cathode field emission devices and more particularly to field emission devices employed as active device components of differential amplifiers and current switch circuits.

BACKGROUND OF THE INVENTION

Differential amplifiers and current steering circuits are known in the art. Typically, differential amplifiers and current steering circuits are realized by employing semiconductor active devices such as, for example, field effect transistors. Field effect transistors, being semiconductor based and providing for charge transport in a condensed matter medium suffer from an inherent limitation in the maximum transport velocity which can be attained. This transport velocity limitation is typical of all bulk transport devices. Further, semiconductor based active devices function in a manner which requires that during switching periods excess charge carriers must be removed from areas within the device. In the instance of bi-polar transistor devices stored charge must be removed from the base region. In the instance of field effect transistors charge must be re-distributed in the region of the device channel. The velocity limitation and charge re-distribution effects required result in an upper frequency limitation above which semiconductor devices may not be practically employed.

Many systems applications may be anticipated wherein data transmission rates and/or operating frequencies are desired which can not be conveniently achieved by employing known semiconductor switching devices.

Accordingly there exists a need for an active device which overcomes at least some of the shortcomings of the existing art.

SUMMARY OF THE INVENTION

This need and others are substantially met by provision of a field emission device switching circuit having an upper frequency limit substantially above that of circuits employing bulk-transport semiconductor devices, including a plurality of field emission devices each with an emitter, a gate extraction electrode and an anode, electrical connections between the emitters of first selected ones of the plurality of field emission devices, independent electrical connections between the anodes of second selected ones of the first selected ones of the plurality of field emission devices and the emitter electrodes of third selected ones of the plurality of field emission devices, and independent electrical connections between the gate extraction electrodes of fourth selected ones of the plurality of field emission devices, such that an externally provided electron current is selectively switched through some of the field emission devices by selectively energizing some of the field emission devices of the plurality of field emission devices.

This need and others are further met by provision of a switching circuit, having an upper frequency limit substantially above that of circuits employing bulk-transport semiconductor devices, including a plurality of field emission devices each with an emitter, a gate extraction electrode and an anode, and electrical interconnections between first selected ones of the plurality of field emission devices and second selected ones of the plurality of field emission devices in a manner which provides for a plurality of groups of field emission devices exhibiting parallel operation of field emission devices within each group of the plurality of groups and independent operation with respect to other groups of the plurality of groups of electrically interconnected field emission devices and further interconnected so that the relationship between the number of electrically interconnected field emission devices in each group of the plurality of groups is expressed as a mathematical relationship.

DETAILED DESCRIPTION OF THE PREFERRED EMBODIMENTS

Figure 1A:
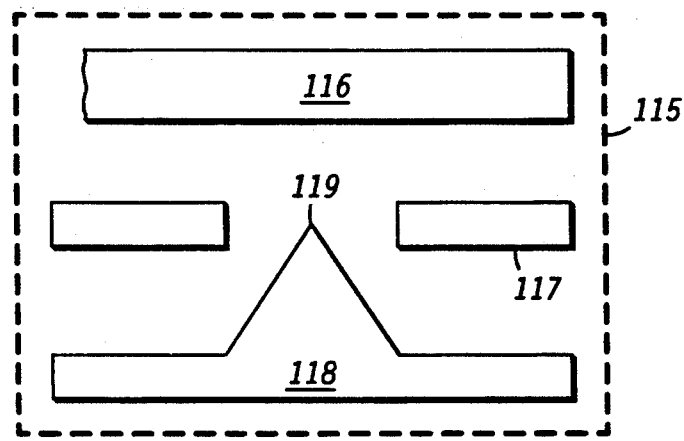
FIG. 1A is a side-elevational/schematic representation of a field emission device.

FIG. 1A is a depiction of a side-elevational/schematic representation of a field emission device (FED) 115 including an electron emitter electrode 118 having a geometric discontinuity of small radius of curvature 119 for emitting electrons, a gate extraction electrode 117, and an anode 116. FED 115 is typically operated by applying an externally provided potential (not depicted) between emitter electrode 18 and gate extraction electrode 117 so that an enhanced electric field exists at the region of geometric discontinuity of small radius of curvature, hereinafter referred to as emitter tip 119. Providing that the electric field at emitter tip 119 is of sufficient magnitude, electrons will be emitted from emitter electrode 118 substantially at the region of emitter tip 119. Reducing the magnitude of or removing the externally provided potential results in a reduced electric field at emitter tip 119 of emitter electrode 118 which eliminates the mechanism that induces electron emission. Applying an externally provided potential between anode 116 and emitter electrode 118 will allow at least some of any emitted electrons to be collected at the anode.

Figure 1B:
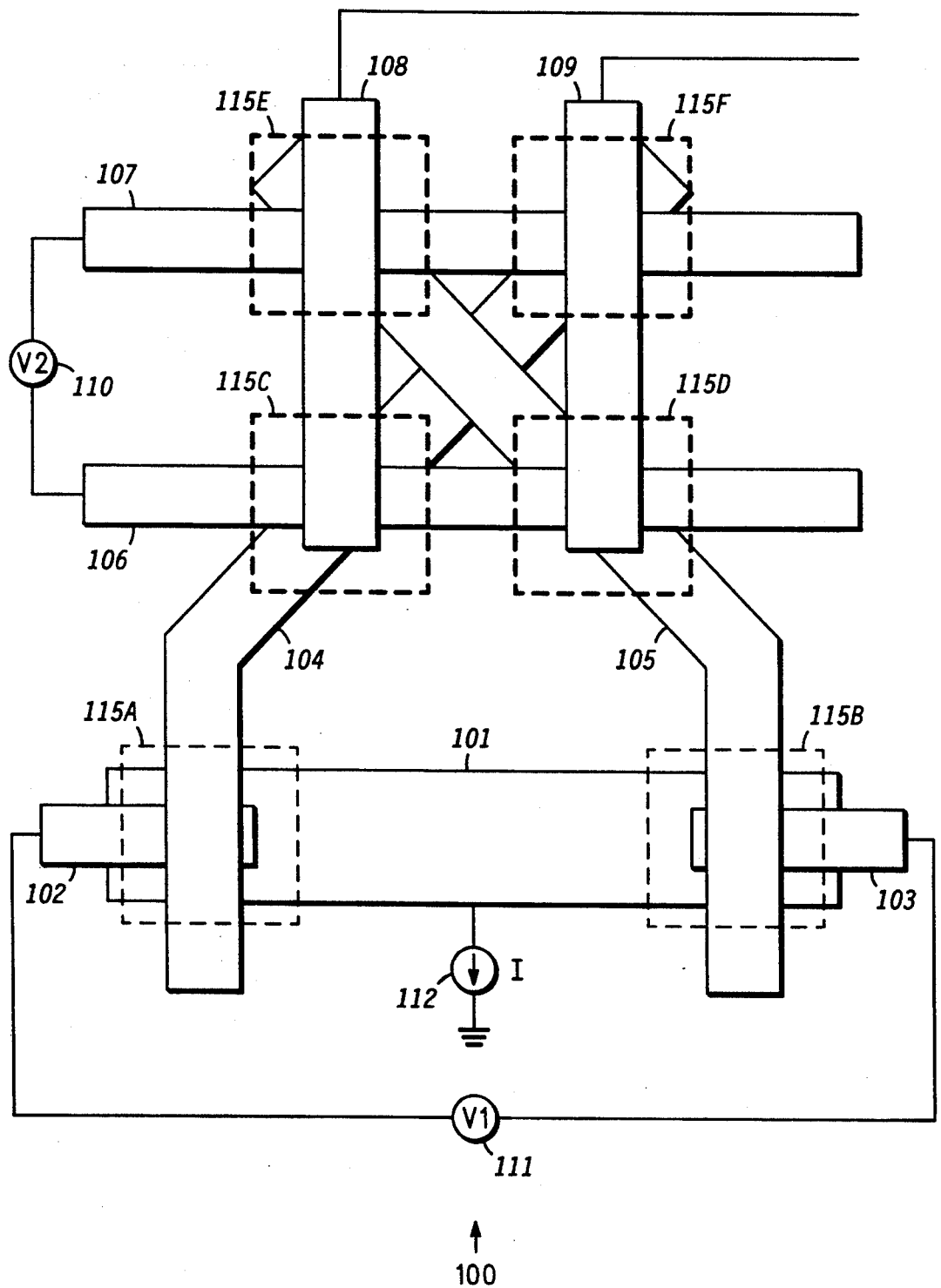
FIGS. 1B and 1C are top plan views of switching circuits employing field emission devices in accordance with the present invention.

Referring now to FIG. 1B there is depicted a top plan view of a switching circuit 100 employing field emission devices in accordance with the present invention wherein a plurality (in this embodiment six) of FEDs 115A-115F (illustrated as broken line boxes) are selectively preferentially interconnected. For convenience of description the six FEDs have been positioned in the drawings as a pair of FEDs: 115A, 115B and associated FEDs 115C, 115D and 115E and 115F. A conductor 101 is employed to define and electrically connect the emitter electrodes of FEDs 115A and 115B. Conductors 102 and 103 define and electrically connect the gate extraction electrodes of FEDs 115A and 115B, respectively. A conductor 104 is electrically connected to the anode of FED 115A and the emitter electrodes of FEDs 115C and 115F. A conductor 105 is electrically connected to the anode of FED 115B and the emitter electrodes of FEDs 115D, 115E. A conductor 108 is electrically connected to the anodes of FEDs 115C and 115E. A conductor 109 is electrically connected to the anodes of FEDs 115D and 115F. A conductor 106 is electrically connected to the gate extraction electrodes of FEDs 115C, 115D. A conductor 107 is electrically connected to the gate extraction electrodes of FEDs 115E and 115F. An externally provided current source 112 is shown operably connected to conductor 101. An externally provided voltage source 110 is operably connected between conductors 106 and 107. A second externally provided voltage source 111 is operably connected between conductors 102 and 103. Voltage sources 110 and 111 represent any differential voltage which may exist between the pairs of conductors associated with the respective voltage source.

A typical operation of field emission device switching circuit 100 is as a signal modulator/demodulator wherein first and second time varying input signals, represented as voltage sources 110 and 111 respectively, are applied to the gate extraction electrodes of respective FEDs. This operation results in a modulated output signal/baseband signal which appears at the FED switching circuit output that is operably coupled to either/both of conductors 108 and 109. In the mode of operation presently under consideration application of voltage source 111 results in a corresponding time variation of the potential applied between the gate extraction electrode and emitter electrode of each of FEDs 115A and 115B. This variation of potential at FED 115B is out of phase 180 degrees with reference to the potential variation at FED 115A. As such, one of the FEDs 115A and 115B will be shifting to a state of reduced conduction while the other will be moving to a state of increased conduction.

Externally provided current source 112 maintains a constant current through switching circuit 100, which results in the time varying voltage source 111, functioning as a steering signal to shift the current first through one of the FEDs 115A and 115B, then through the other, and repeating in accordance with the time dependence of voltage source 111.

In concert with the time varying voltage source 111, application of the other time varying voltage source 110, results in a similar shifting of the operating states of FEDs 115C, 115D, 115E and 115F. Particularly, as voltage source 110 is applied a time varying potential results between gate extractor electrodes and emitter electrodes of FEDs associated with either of conductors 106 and 107 to which voltage source 110 is applied. The time varying potential exhibits a phase reversal characteristic such that a positively varying voltage at either of conductors 106 or 107 will result in a negatively varying voltage at the other conductor 106 or 107. This characteristic results in pairs of FEDS 115C and 115D or 115E and 115F shifting to a state of reduced conduction while the opposite pairs of FEDS 115C and 115D or 115E and 115F shift to a state of increased conduction.

With time varying input signals applied as voltage sources 110, 111, it is observed that the corresponding variation in the conduction state of the FEDs of switching circuit 100 results in a time varying distribution of the constant current which passes through either of the conductors 108 or 109, while the total of the current which passes through conductors 108 and 109 remains invariant.

The switching speed of the FEDs employed in switching circuit 100 are typically on the order of less than one picosecond. As such it is anticipated that field emission device switching circuit 100 may be employed as a modulator/demodulator in electronic applications wherein the operating signals are at frequencies on the order of 1.0 Terahertz.

Figure 1C:
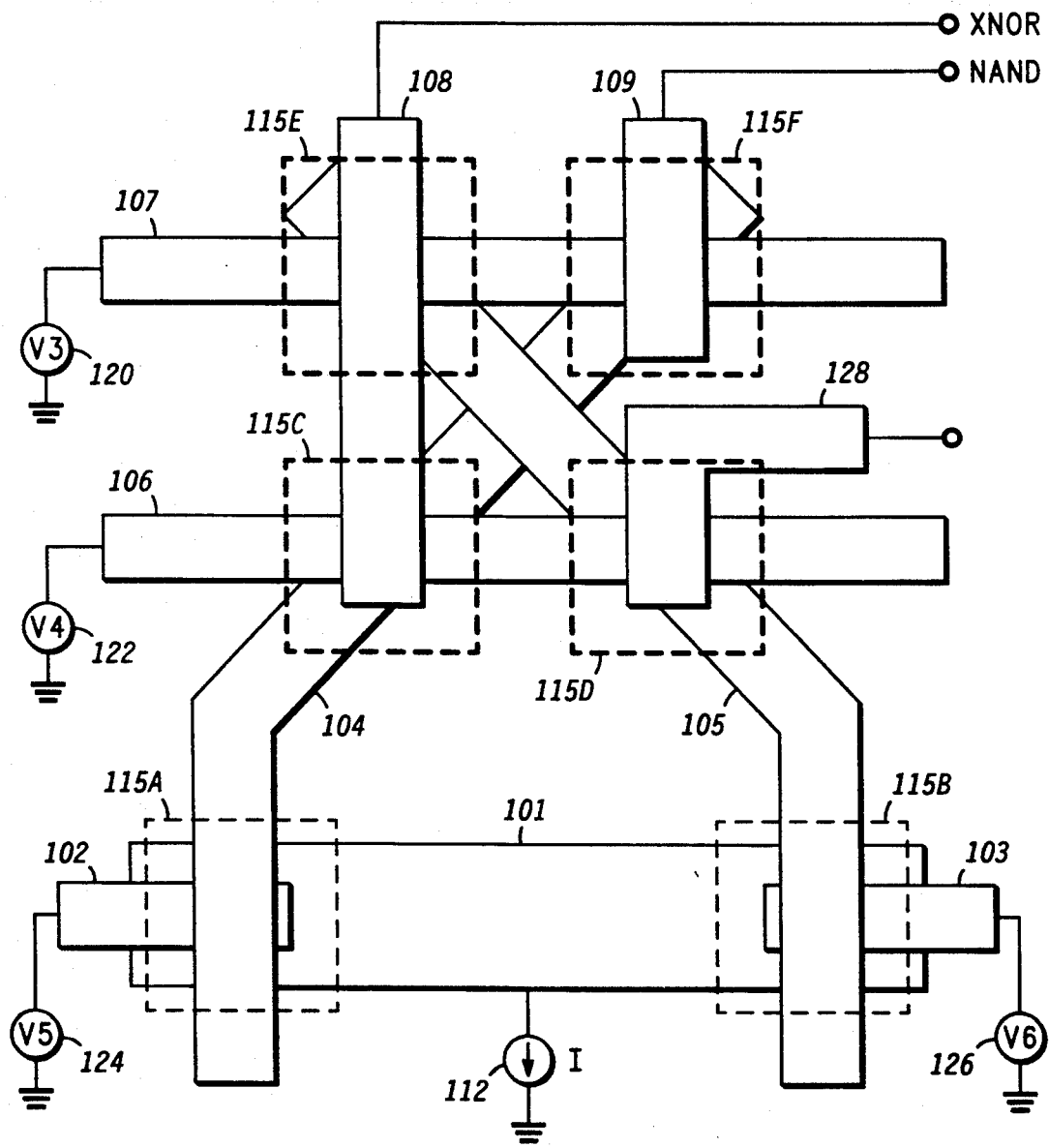

FIG. 1C illustrates FED switching circuit 100, described previously with reference to FIG. 1B, connected for a different operation. In FIG. 1C voltage sources 110 and 111 have been removed and replaced with externally provided voltage sources 120, 122, 124 and 126 operably connected to conductors 107, 106, 102 and 103 respectively. Operation of switching circuit 100 with voltage sources applied as in FIG. 1C provides for a family of logic circuit functions.

For the connection of switching circuit 100, under consideration, a logic high input state is described as a high voltage applied at the voltage source of interest. A logic low input state is described as a substantially lower voltage applied at the voltage source of interest. In the instance of the output states, appreciable current drain at a particular one of the conductors 108 or 109 constitutes a logic low output state while the absence of appreciable current into a particular one of the conductors 108 or 109 constitutes a logic high output state. The family of logic functions may be derived by placing restrictions on the relationships between the externally provided voltage sources.

As an example, it may be imposed that the input signal levels of voltage sources 124 and 126 must be opposite where the level of voltage source 124 is considered as the logic input level. That is, when logic input voltage source 124 is high voltage source 126 is required to be low. A corresponding relationship may be established between voltage sources 120 and 122, where voltage source 120 is considered for the purposes of this example to be the logic input level. In this example, conductor 109 contacts the anode of FED 115F and another conductor 128, contacts the anode of FED 115D. When this is the case switching circuit 100 will provide an exclusive-NOR (X-NOR) logic function at the output associated with conductor 108 and a not-AND (NAND) logic circuit function at the output associated with conductor 109. Conductor 128 may be operably coupled to an output when detection of the absence of any logic high level, that is, when both voltage sources 120 and 124 are at a logic low state, is desired.

In still another example of a logic circuit utilizing switching circuit 100 connected to voltage sources as in FIG. 1C, by interconnecting conductors 108 and 109 a logic NOR function is realized.

Subsequently, an additional inverter device (not depicted), which may also be an FED, may be employed to realize logic AND and OR functions in conjunction with the circuitry of FIG. 1C.

Alternatively, the logic levels may be defined as the levels associated with any other of the identified input voltage sources and other combinations of prescribed voltage source relationships may be identified to provide logic functions not detailed specifically in the example presented. It is anticipated that a full range of logic functions including logic functions employing multiple inputs greater than two may be realized which employ the high speed operating characteristics of field emission devices.

The switching speed of the FEDs of switching circuit 100 provides for realization of logic functions which may be employed in data transmission and processing systems wherein it is desirable to achieve a data transmission rate/processing rate on the order of 100 gigabits per second.

Figure 2:
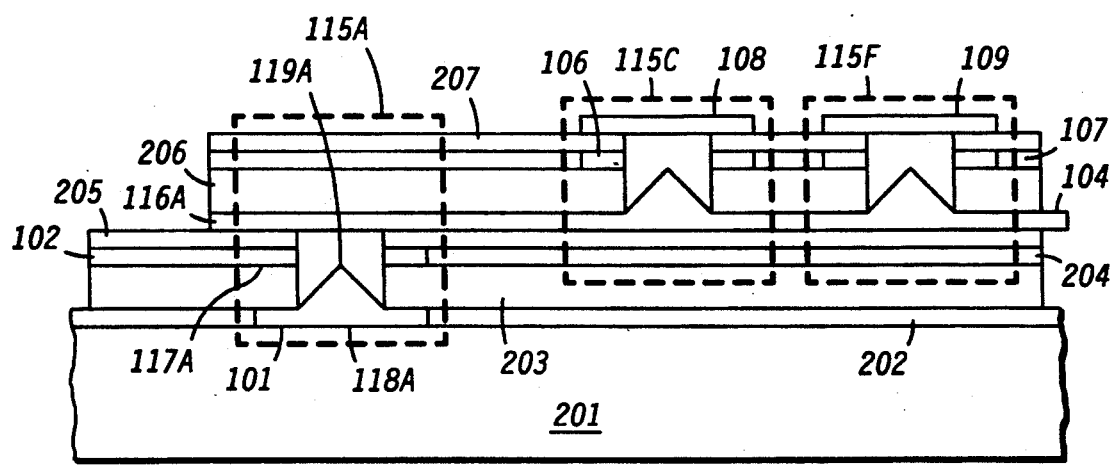
FIG. 2 is a partial side-elevational cross-sectional depiction of the switching circuit illustrated in FIG. 1B.

FIG. 2 is a partial side-elevational, cross-sectional depiction of the embodiment of FED switching circuit 100, as illustrated in top plan in FIG. 1B. FIG. 2 illustrates three FEDs 115A, 115C and 115F of switching circuit 100, and some of the connections thereto. Each of the FEDs is enclosed in a broken line box, designated 115A, 115C and 115F for simplicity in viewing and understanding the structure. Those skilled in the art will realize from this view the novel and simplified connections that are incorporated in switching circuit 100 through the use of vertical FEDs.

A supporting substrate 201 is provided on which is disposed conductor 101 having an emitter electrode 118A with a geometric discontinuity of small radius of curvature 119A formed thereon. A gate extraction electrode 117A is depicted as connected to, or formed in, a conductor 102. An anode 116A is shown connected to, or formed in, a first layer of conductive material 104 which is connected to the emitter electrodes of FEDs 115C and 115F. In the cross-sectional view of FIG. 2, some of the switching circuit features appear as end view depictions. For example, conductors 106 and 107, which are coupled to the gate extraction electrodes of FEDs 115C and 115F respectively, are depicted in end view as are conductors 108 and 109, which are coupled to the anodes of FEDs 115C and 115F. It will of course be understood from FIGS. 1B and 2 that the gate extraction electrodes of FEDs 115C-115F are all easily formed as a part of a second conductive layer, which also forms conductors 106 and 107. Similarly, the anodes of FEDs 115C-115F are all formed as a part of a third conductive layer, which also forms conductors 108 and 109. A plurality of insulative layers 202, 203, 204, 205, 206 and 207 are depicted on which the various conductors and FED electrodes are disposed and are realized by any of the many techniques commonly employed in the known art.

Of significance in the construction of switching circuit 100 depicted in FIG. 2, is the vertical integration employed to realize the interconnection of a field emission device anode to subsequent field emission device emitter electrodes and the vertical integration of field emission devices in general.

Figure 3:
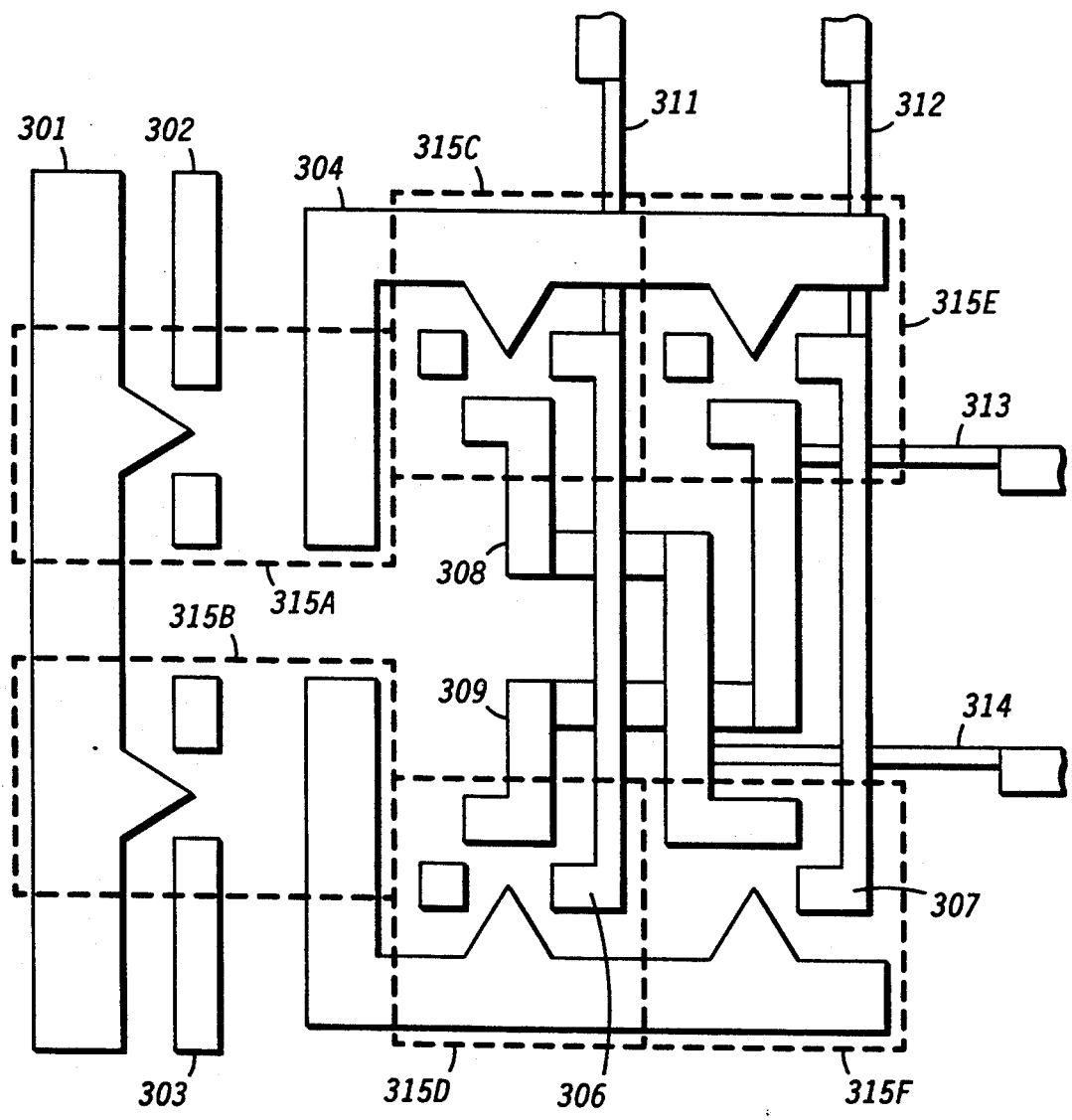
FIG. 3 is a top plan view of another embodiment of a switching circuit in accordance with the present invention.

FIG. 3 is a top plan view of a FED switching circuit 300, similar to that described previously with reference to FIG. 1B, realized as a planar construction. Similar components are designated with similar numbers having a "3" prefix to indicate the different embodiment. Switching circuit 300 includes conductive interconnects 311 and 312 to operably connect conductors 306 and 307 to associated externally provided circuitry. Similarly interconnects 313 and 314 are provided to operably connect conductors 308 and 309 to any externally provided circuitry. The six FEDs in switching circuit 300, corresponding to the six FEDs in switching circuit 100, are enclosed in broken line boxes designated 315A through 315F so that the various electrodes thereof will be easily recognized by those skilled in the art. Also, the simplicity of constructing switching circuit 300 with FEDs as the active components is easily understood from this view.

Figure 4:
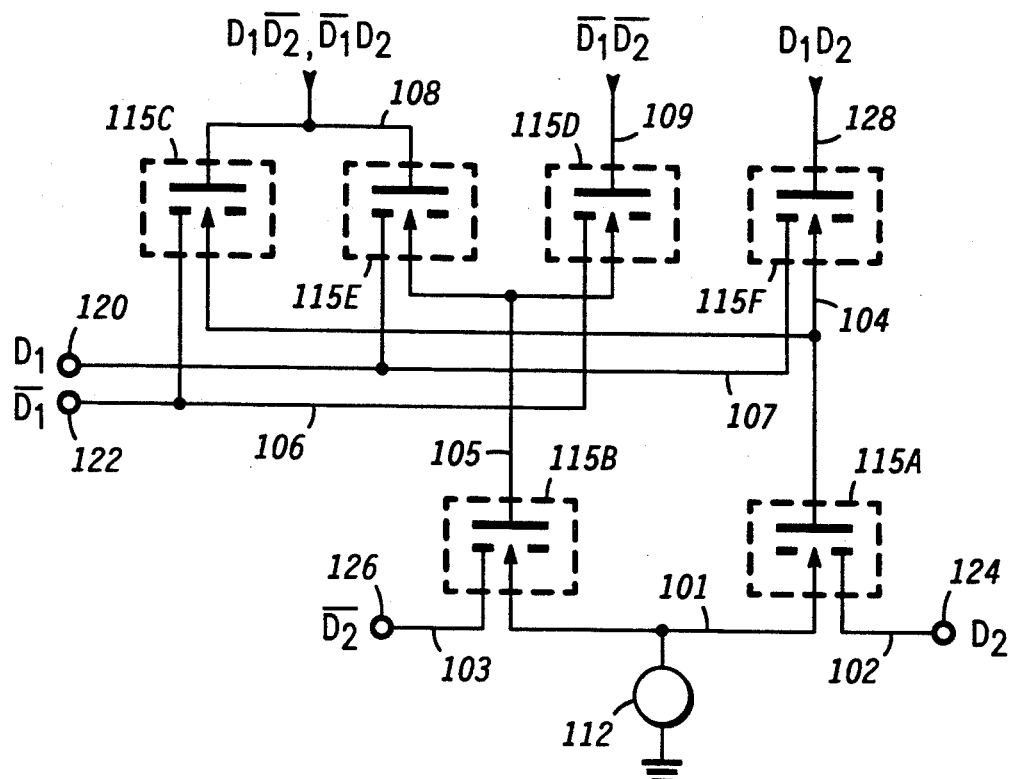
FIG. 4 is a schematic representation of the switching circuit illustrated in FIG. 1C.

FIG. 4 is a schematic representation of the switching circuit described previously with reference to FIG. 1C wherein a family of logic functions has been realized by prescribing logic input levels, herein designated as D1 and D2, and associated other input levels herein designated as not-D1 and not-D2 which are required to maintain a logic level opposite to that of the associate logic input. Similar components are designated with similar numbers so that the various interconnections in FIG. 1C and FIG. 4 can be easily compared.

Figure 5:
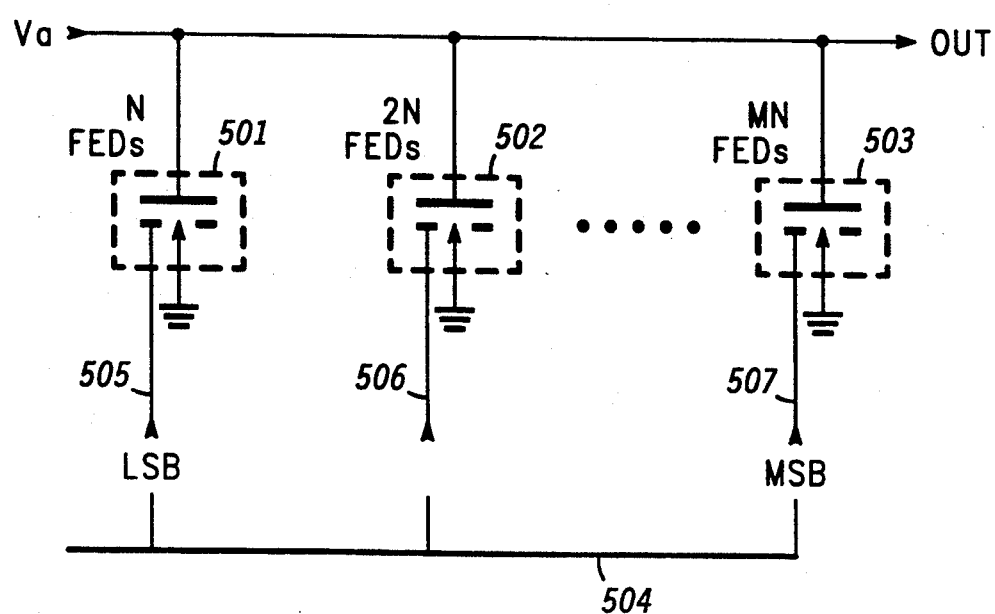
FIG. 5 is a schematic representation of a second embodiment of an application of a field emission device switching circuit in accordance with the present invention.

Referring now to FIG. 5 there is depicted a schematic representation of a FED switching circuit 500 employed as a digital to analog converter. In switching circuit 500, a plurality of input signal conductors 505, 506, 507, etc. form an input buss 504 for providing digital input information to pluralities of groups of FEDs 501, 502, 503, etc., respectively. In FIG. 5, a single FED is illustrated to represent each of the pluralities of groups 501, 502, 503, etc. Each plurality of groups of FEDs 501, 502, 503 is selectively enabled when the associated conductor 505, 506, or 507, which is connected to the gate extraction electrodes of the particular plurality of groups of FEDs, carries a logic high level. By establishing a mathematical relationship governing the number of FEDs in each of the plurality of groups 501, 502, 503, etc., a preferred output level may be established. As an example if the relationship between the pluralities of groups follows the form N, 2N, 4N, ... MN wherein M is the highest desired even-integer multiple of N and wherein N is a desired common plurality of FEDs within each group of the pluralities of groups then the switching circuit will provide a binary digital to analog signal conversion of multi-bit binary information. It should be understood that a group 'N' of FEDs, including any selected number of FEDs from a single FED to a large plurality, is used to improve reliability, increase current carrying capabilities, and for many other advantages.

In another embodiment the field emission device switching circuit may be configured exhibiting a mathematical relationship which may be expressed as $N^M g$ wherein N is a desired common number of field emission devices within each group of the plurality of groups and wherein a first group of the plurality of groups includes $N^1$ field emission devices of the plurality of field emission devices and wherein other groups not the first group are mathematically related with respect to the number of field emission devices in each group through a common relationship of the exponential $M_g$ of the associated group to the first group.

In still another embodiment the field emission device switching circuit may be configured exhibiting a mathematical relationship which may be expressed as $N\exp^M g$ wherein N is a desired common number of field emission devices within each group of the plurality of groups and wherein a first group of the plurality of groups includes N field emission devices of the plurality of field emission devices and wherein other groups not the first group are mathematically related with respect to the number of field emission devices in each group through a common relationship of the exponential $\exp^M g$ of the associated group to the first group.

Clearly it is anticipated that other conversion schemes may be realized by employing other mathematical relationships not specifically detailed in this disclosure but certainly within the scope of the present invention. Thus, a variety of FED switching circuits is disclosed, which switching circuits are practically not limited in upper frequencies and include many advantages in construction because of simplified interconnections. Because of the greatly extended upper frequency limits of the disclosed embodiments, data transmission rates and/or operating frequencies can be achieved which were previously extremely difficult or impossible. Further, because of the simplicity and extremely small size of the FEDs utilized in the disclosed embodiments, large numbers of FEDs can be used to provide applications and reliabilities not previously possible or practical.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What we claim is:

1. A switching circuit, having operating capabilities substantially above an upper frequency limit of circuits employing bulk-transport semiconductor devices, comprising:
    a plurality of field emission devices each with an emitter, a gate extraction electrode and an anode;
    electrical connections between the emitters of selected ones of the plurality of field emission devices;
    independent electrical connections between the anodes of selected ones of the plurality of field emission devices and the emitter electrodes of selected ones of the plurality of field emission devices; and
    independent electrical connections between the gate extraction electrodes of selected ones of the plurality of field emission devices,
    such that an externally provided electron current is selectively switched through some of the field emission devices by selectively energizing some of the field emission devices of the plurality of field emission devices.

2. The switching circuit of claim 1 wherein the plurality of field emission devices are selectively interconnected in a manner which provides for an exclusive-OR (XOR) logic function.

3. The switching circuit of claim 1 wherein the plurality of field emission devices are selectively interconnected in a manner which provides for a not-OR (NOR) logic function.

4. The switching circuit of claim 1 wherein the plurality of field emission devices are selectively interconnected in a manner which provides for a not-AND (NAND) logic function.

5. The switching circuit of claim 1 wherein the plurality of field emission devices are selectively interconnected in a manner which provides for an AND logic function.

6. The switching circuit of claim 1 wherein the plurality of field emission devices are selectively interconnected in a manner which provides for a signal modulator function.

7. The switching circuit of claim 1 wherein the plurality of field emission devices are selectively interconnected in a manner which provides for a signal demodulator function.

8. The switching circuit of claim 1 wherein the plurality of field emission devices include vertically integrated field emission devices.

9. The switching circuit of claim 1 wherein the plurality of field emission devices include planar construction field emission devices 10. A switching circuit, having operating capabilities substantially above an upper frequency limit of circuits employing bulk-transport semiconductor devices, comprising:
    a first pair of field emission devices each including an emitter formed on a semiconductor substrate and each further including an anode formed in a first conductive layer of material spaced from the substrate, the anodes of the first pair of field emission devices being electrically separate and the emitters being electrically connected;
    a second pair of field emission devices each including an emitter formed in the first conductive layer of material, with each emitter being electrically connected to a different anode of the first pair of field emission devices;
    a third pair of field emission devices each including an emitter formed in the first conductive layer of material, with each emitter being electrically connected to a different anode of the first pair of field emission devices; and
    each field emission device in the second and third pairs of field emission devices having a gate extraction electrode, with the gate extraction electrodes of the second pair of field emission devices being formed and electrically connected in a second conductive layer and the gate extraction electrodes of the third pair of field emission devices being formed and electrically connected in the second conductive layer.

11. A switching circuit as claimed in claim 10 wherein the second and third pairs of field emission devices include anodes formed in another layer of conductive material spaced from the second conductive layer, with the anodes of one of the field emission devices of each of the second and third pairs of field emission devices being connected by the another layer of conductive material and the anodes of the other field emission device of each of the second and third pairs of field emission devices being connected by the another layer of conductive material.

12. A method of forming a switching circuit including a pair and associated field emission devices each with an emitter, a gate extraction electrode and an anode and having operating capabilities substantially above an upper frequency limit of circuits employing bulk-transport semiconductor devices, comprising the steps of:
    providing a supporting substrate;
    forming a conductor on the substrate, which conductor defines the emitters for the pair of field emission devices and an electrical connection between the emitters;
    forming a first conductive layer in overlying relationship to the conductor and spaced therefrom, the first conductive layer defining the anode for each of the pair of field emission devices and defining emitters for the associated field emission devices with independent electrical connections between each of the anodes of the pair of field emission devices and the emitter electrodes of selected ones of the associated field emission devices; and forming a second conductive layer in overlying relationship to the first conductive layer and spaced therefrom, the second conductive layer defining gate extraction electrodes for the associated field emission devices and independent electrical connections between the gate extraction electrodes of selected ones of the associated field emission devices, such that an externally provided electron current is selectively switched through some of the pair and associated field emission devices by selectively energizing some of the pair and associated field emission devices.

13. A method of forming a switching circuit as claimed in claim 12 including in addition the step of forming a third conductive layer in overlying relationship to the second conductive layer and spaced therefrom, the third conductive layer defining anodes for the associated field emission devices and independent electrical connections between the anodes of selected ones of the associated field emission devices.

* * * * *